United States Patent
Wiezorek et al.

(10) Patent No.: US 6,265,840 B1
(45) Date of Patent: Jul. 24, 2001

(54) ELECTRONIC DEVICE

(75) Inventors: Hans-Werner Wiezorek, Eppstein; Barbara Wolf, Schwalbach, both of (DE)

(73) Assignee: Mannesmann VDO AG, Frankfurt (DE)

(*) Notice: Subject to any disclaimer, the term of this patent is extended or adjusted under 35 U.S.C. 154(b) by 0 days.

(21) Appl. No.: 09/464,607

(22) Filed: Dec. 15, 1999

(30) Foreign Application Priority Data

Dec. 15, 1998 (DE) .............................. 198 57 840

(51) Int. Cl.$^7$ ..................................................... H02P 7/00
(52) U.S. Cl. ........................... 318/434; 361/712; 361/734
(58) Field of Search ...................................... 361/601, 679, 361/704, 712, 734; 318/139, 434; 307/10.1, 10.7

(56) References Cited

U.S. PATENT DOCUMENTS

| | | | | |
|---|---|---|---|---|
| 4,292,665 | * | 9/1981 | Hersom et al. | 363/141 |
| 4,639,834 | | 1/1987 | Mayer | 361/388 |
| 5,016,139 | * | 5/1991 | Stopa et al. | 361/386 |
| 5,097,404 | * | 3/1992 | Layh | 363/146 |
| 5,835,350 | * | 11/1998 | Stevens | 361/704 |
| 5,912,514 | * | 6/1999 | Stendardo et al. | 307/64 |
| 5,926,659 | * | 7/1999 | Matsui | 396/206 |

FOREIGN PATENT DOCUMENTS

| | | |
|---|---|---|
| 9002596 | 5/1990 | (DE) . |
| 4118398 | 12/1992 | (DE) . |
| 4333387 | 3/1994 | (DE) . |

* cited by examiner

*Primary Examiner*—Robert E. Nappi
*Assistant Examiner*—Rina I. Duda
(74) *Attorney, Agent, or Firm*—Martin A. Farber

(57) ABSTRACT

An electronic device for a motor vehicle, having an electronics unit designed for switching high currents in a two-part housing, a capacitor unit being arranged in the housing to suppress the interference signals produced by said high currents.

In an electronic device which is easy to manufacture and in which the heat produced by the electronic circuits has no further effect on the operation of the electronic circuit, the capacitor unit, which is designed to have a large surface area, is thermally connected to a first housing part (1), and the electronics unit (8, 9) is thermally connected to a second housing part (2).

14 Claims, 6 Drawing Sheets

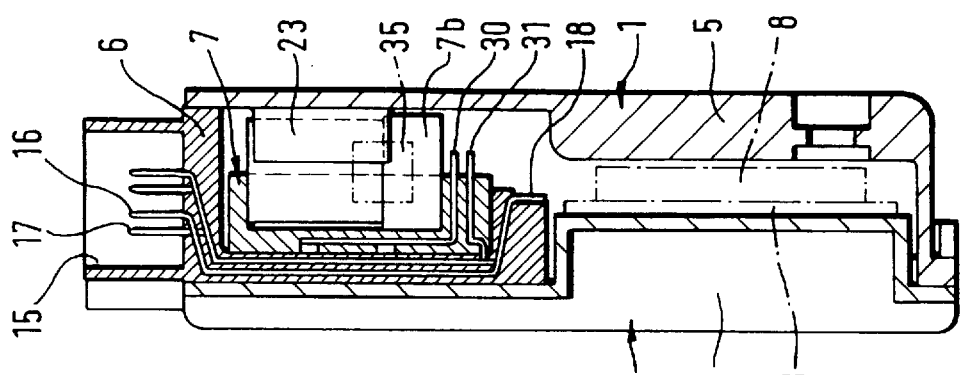
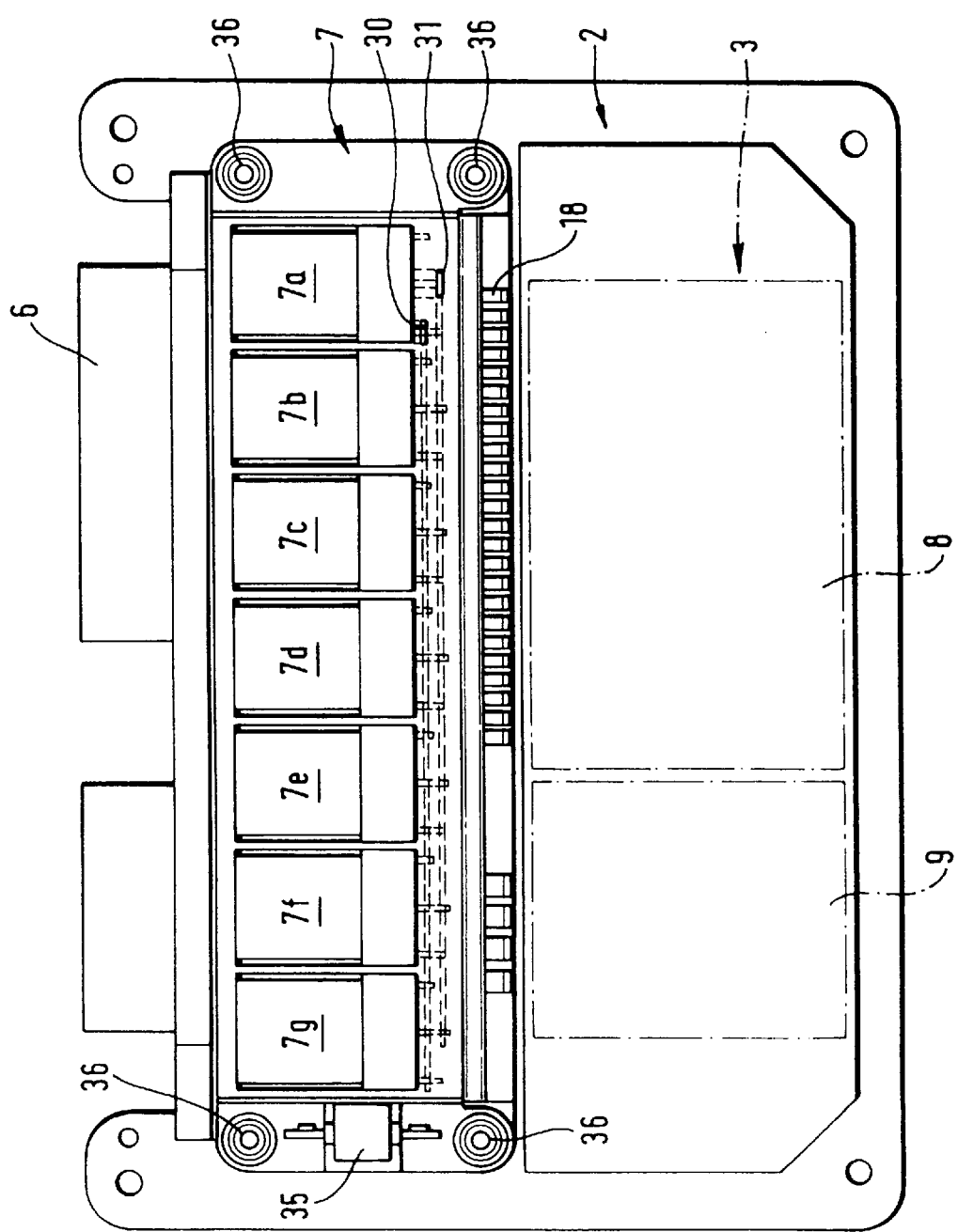
Fig. 4
Fig. 5

ELECTRONIC DEVICE

FIELD AND BACKGROUND OF THE INVENTION

The invention relates to an electronic device for a motor vehicle, having an electronics unit designed for switching high currents in a two-part housing, a capacitor unit being present to suppress the interference signals produced by the high currents.

Controllers are known which, in addition to the control electronics, also contain a power output stage for driving an actuator in the motor vehicle. For driving the actuator, such as an electric motor for window lifting mechanisms or for producing a valve stroke in a motor vehicle, the power output stages supply high currents. In the case of clocked driving, the switching of the high currents produces interference signals inside the controller, the levels of these interference signals being many times higher than the levels of the signals processed by the control electronics. The physically close arrangement of these different circuits in a controller means that the signals in the control device are affected by these electromagnetic interference signals. To produce electromagnetic compatibility for these two arrangements, the controllers have electrically connected capacitors which compensate for the interference signals.

In operation, the power electronics and the capacitors both produce a high heat loss which is dissipated to the surroundings via the housing.

This requires comprehensive designs for the housing in the form of cooling ribs to dissipate the heat produced quickly.

SUMMARY OF THE INVENTION

The invention is based on the object of providing an electronic device which is easy to manufacture and in which the heat produced by the electronic circuits does not affect the operation of the electronic circuits further.

The invention achieves the object in that the capacitor unit, which is provided to have a large surface area, is thermally connected to a first housing part, and the electronics unit is thermally connected to a second housing part.

The advantage of the invention is that the two components, which produce different levels of heat loss, are thermally decoupled. The configuration of the heat sink for each housing part can be matched to the specific circumstances.

In one refinement, the modular capacitor unit can be fitted into a connector unit which is of modular form and is mounted on the first housing part. The modular configuration of both the capacitor unit and the connector unit enables simple installation in the housing. For the capacitor unit, separate mounting means are dispensed with completely. It is locked on the housing with the connector unit.

To ensure that the capacitor unit is located robustly, the capacitor unit is prestressed against the first housing part by a spring element supported on the second housing part. In addition, this arrangement makes the capacitor unit insensitive to vehicle vibrations. Vehicle movements have no effect on the electrical connections of the capacitor unit. This means that short circuits are reliably prevented.

In another refinement, the connector unit and the capacitor unit are mechanically mounted independently of one another on the second housing part. This arrangement ensures that the capacitor unit is located so as to withstand vibrations, so that there is no need for additional measures to ensure robustness.

Advantageously, a thermally conductive adhesive layer is arranged between the capacitor unit and the first housing part. This thermally conductive adhesive layer not only transfers the heat produced by the capacitor unit to the first housing part but additionally compensates for the large tolerances of the capacitor inside the housing.

In one refinement, contact elements of the connector unit, which are of integral design and are guided outward, run below the capacitor unit and can be connected to the electrical connections of the electronics unit at a bonding surface which faces the interior of the housing. Particularly if the contact elements are designed as a sheet metal casting, such a space-saving shape is easy to produce.

The electronics unit rests flat on the second housing part, which is of plate-like form, for the purpose of thermal coupling. This achieves optimum heat exchange between the electronics and the housing part.

The two housing parts have a rib-like outer surface which is formed with different thicknesses. The arrangement of the capacitor unit and the electronics unit in different housing parts enables a cooling-rib variation which can thus be optimally matched to the amount of heat to be dissipated which is produced by the respective device.

In one refinement, the first housing part is provided to hold the individual capacitor elements forming the capacitor unit with a form fit. In this arrangement, the capacitor elements are placed directly onto the housing part, which produces direct thermal contact.

Particularly when commercially available capacitor cells are used, the inner surface of the first housing part has semicircular depressions corresponding to the outer contour of the capacitor elements.

In this case, the capacitor elements form two regions which are isolated by baffle plates connected to different electrical potentials. This arrangement eliminates the need for extensive line connections for the capacitors.

In this arrangement, the baffle plates are approximately L-shaped, which enables space-saving installation.

In order to provide an electronic device which is as small as possible, the first housing part rests on a hybrid frame which is connected to the second housing part, which bears the electronics unit, with a form fit.

BRIEF DESCRIPTION OF THE DRAWINGS

The invention has numerous embodiments. Two of these will be explained in more detail with the aid of the figures shown in the drawings, in which FIG. 4: shows a second embodiment of the device according to the invention, FIG. 5: shows a section through the second embodiment.

DETAILED DESCRIPTION OF THE PREFERRED EMBODIMENT

Figure 1:
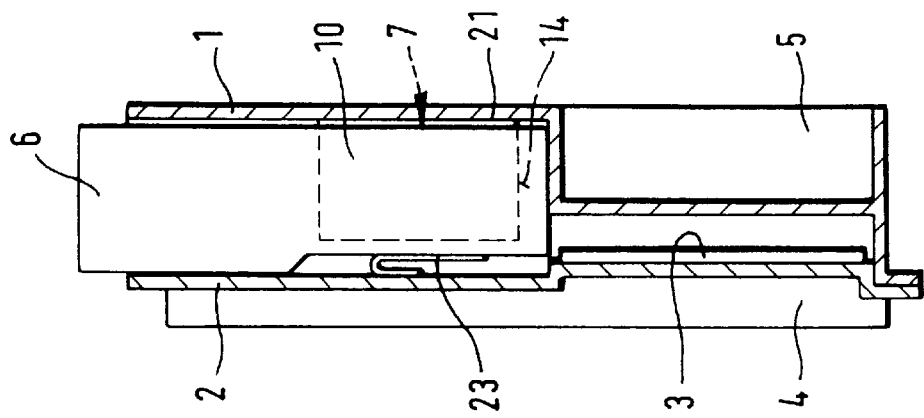
FIG. 1: shows a first embodiment of the device according to the invention.

FIG. 1 shows the basic design of the device according to the invention, as used to drive an electric motor which adjusts the valve stroke of an air inlet valve in an internal combustion engine. It comprises two housing parts 1 and 2, with a hybrid circuit 3 arranged on the second housing part 2. Cooling ribs 4 are formed on the outer surface of the second housing part 2.

The cover-like housing part 1 also has cooling ribs 5. The housing parts 1 and 2 have a connector module 6 arranged between them so as to produce a seal. The connector module 6 bears a capacitor 7 which is arranged physically close to the housing part 1.

Figure 2:
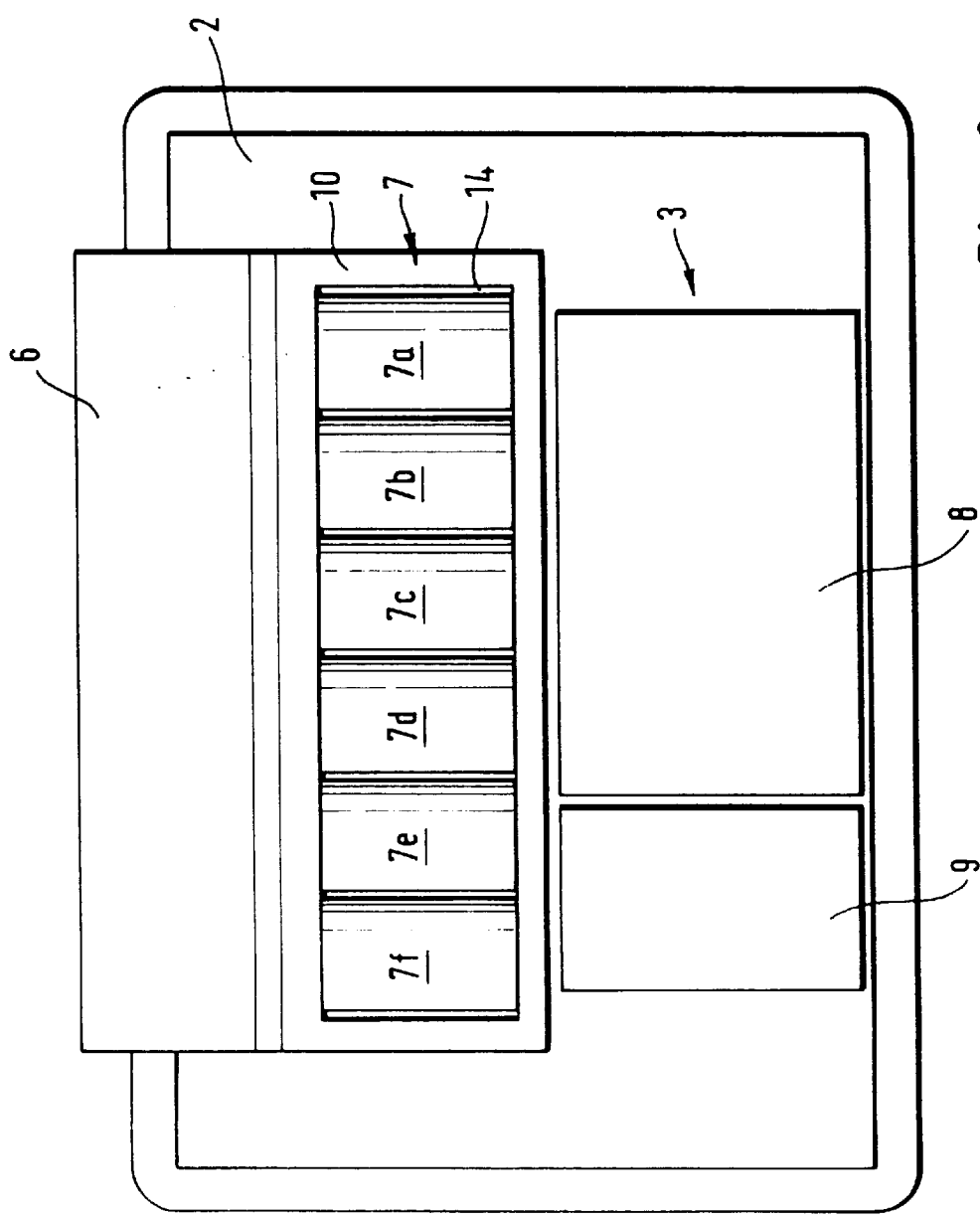
FIG. 2: shows a plan view of the first housing part.

FIG. 2 shows a plan view of the second housing part 2 with connector device 6 and electronics 8, 9. On the housing part 2, there is a processor hybrid 8 which, depending on the process to be monitored, produces control signals for a power output stage module 9 which generates the appropriate switching voltages and currents for the electric motor as requested. The power output stage module 9 is also positioned on the housing part 2.

In this arrangement, the connector module 6 has a connector body 10 which has a recess 14 in it. Commercially available capacitor cells 7a to 7f are fitted into this recess 14.

Figure 3:
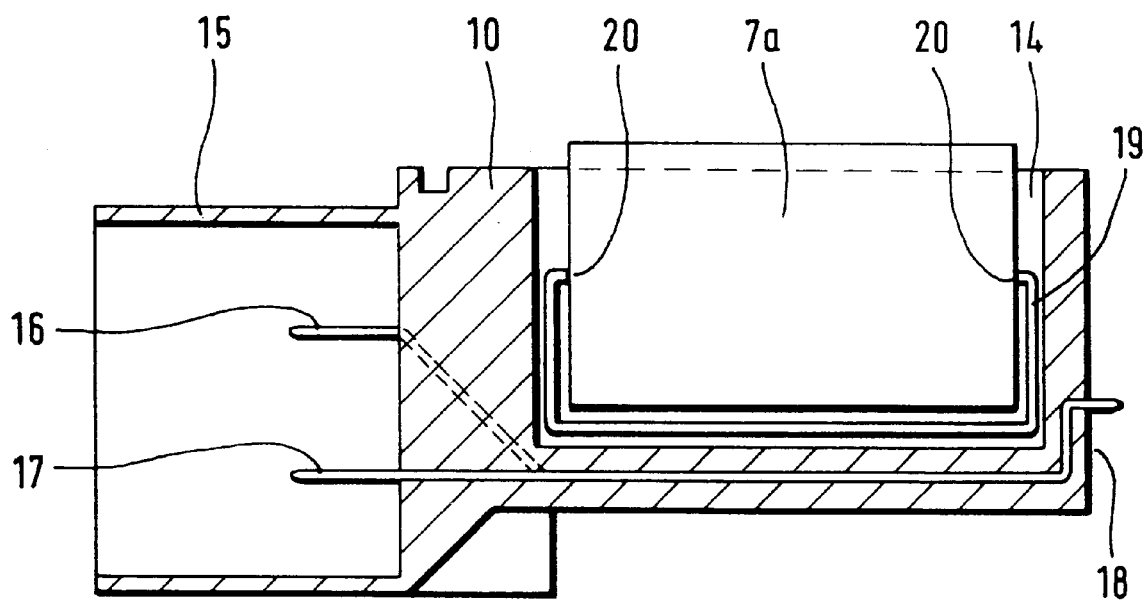
FIG. 3: shows the design of the connector module.

The connector unit 6 is explained in more detail in FIG. 3. As can be seen from this figure, the connector body 10 is of integral design and has a connector inlet 15 into which the connector elements 16 and 17 project. The connector inlet 15 serves to hold the mating connector. To simplify illustration, only two connector elements 16, 17 are shown in this case. A multiplicity of such connector elements is also conceivable, however.

The connector pins 16 and 17 are advantageously designed as sheet metal castings, which are placed into an injection mold and are encapsulated with a plastic by injection molding, the plastic then forming the connector body 10 at the same time. The surface 18 formed opposite the connector inlet 15 then serves as a bonding surface for connecting the connector pin 17 to the electronics 8 and 9.

A contact device 19 for the capacitor 7a is fitted in the recess 14 and is bonded or held mechanically to ensure robust location. Reliable contact is made between the capacitors 7a to 7f and the contact device 19 by welding these capacitors 7a to 7f to the contact device 19 at the weld points 20.

Between the housing part 1 and the capacitor 7, there is a layer of thermally conductive adhesive 21, which ensures that the heat produced by the capacitor 7 is transferred to the aluminum cover 1. On the second housing part 2, which forms the base, there is a spring 22 which presses the part of the connector body 10 which bears the capacitors 7 against the first housing part 1 (FIG. 1).

FIG. 4 shows a second embodiment of the electronic device according to the invention. In this arrangement, the connector part 6 and a capacitor unit 7, in seven capacitor elements 7a to 7g, are produced independently of one another. The capacitor module 7 is mechanically connected to the second housing part via rivet connections 36. The connector unit 6 is then locked mechanically on the second housing part 2 at the same time. The capacitor unit 7 also has a zener diode 35 arranged on it to limit voltage spikes, and this zener diode is also cooled.

The sectional illustration (FIG. 5) shows that the capacitor element 7b projects from the capacitor unit 7 and touches the semicircular depression 23 in the first housing part 1 over the surface for heat dissipation purposes. In this case too, it is appropriate to have a thermally conductive adhesive arranged between the capacitor element 7b and the depression. The baffle plates 30, 31 connect the individual capacitor elements 7a to 7g to the connector elements 16 and 17.

Figure 6:
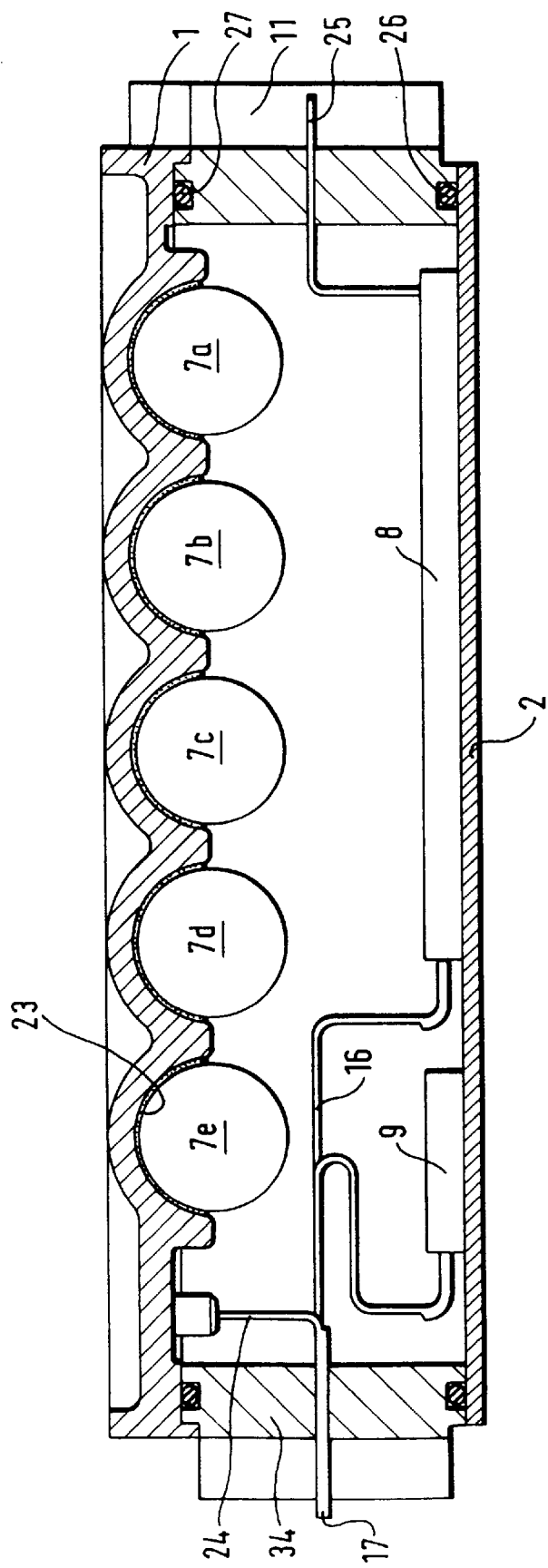
FIG. 6: shows a third embodiment of the device according to the invention.
Figure 8:
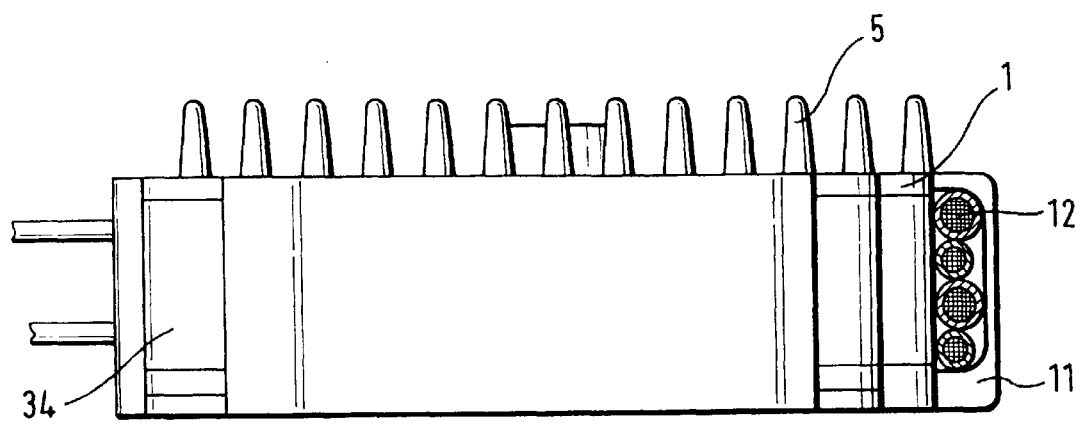
FIG. 8: shows a view of the closed housing. and Identical features are distinguished by identical reference symbols.
Figure 8:
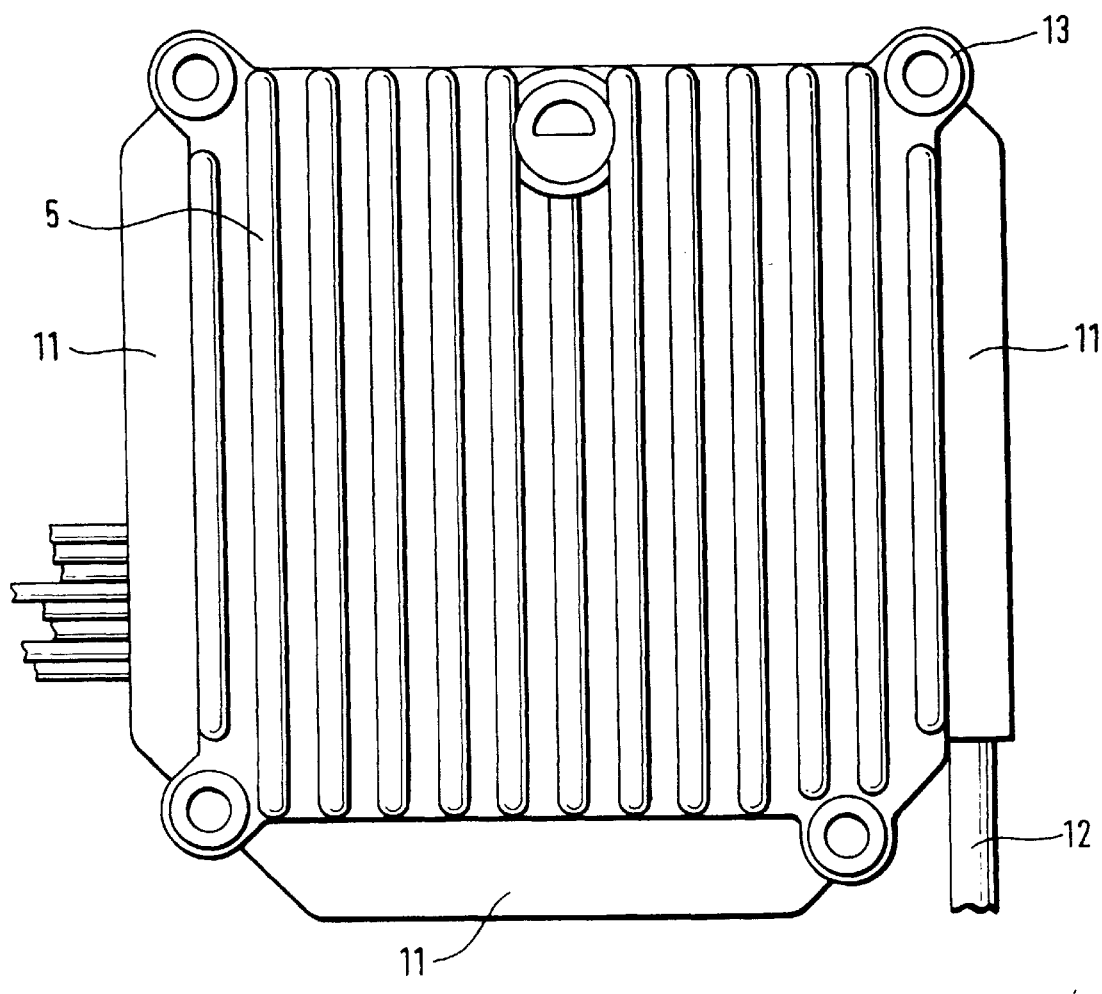

FIG. 6 shows a further embodiment of the invention. Here too, the housing comprises two parts, the housing parts 1 and 2 being of plate-like design. The housing part 2 is designed as a hybrid circuit having the microprocessor circuit 8 and the power output stages 9. The respective lateral ends of the housing part 2 have a circumferentially arranged hybrid frame 34 whose outer side has the cable guide 11, in which the cable 12 is connected (FIG. 8). In this case, the connector elements 16 and 17, which extend on one side through the hybrid frame 34, are connected to the power output stage 9 and to the processor hybrid 8 inside the housing. The first housing part 1 rests on the hybrid frame 34. In this case, the hybrid frame 34 is sealed off against the surroundings by means of a respective circumferential seal 26, 27. The supply voltage is supplied to the power electronics via the connector pin 25.

That side of the housing part 1 which faces the electronics 8, 9 has recesses 23 distributed at regular intervals over the entire surface of the part 1. Each such recess 23 contains a capacitor 7a to 7e, the shape of the recess being matched to the outer surface of the capacitor 7a to 7e. In the example shown, the recess 23 is of semicircular design. The capacitor unit 7 is supplied with voltage via a connector pin 24 on the hybrid frame 34.

Figure 7:
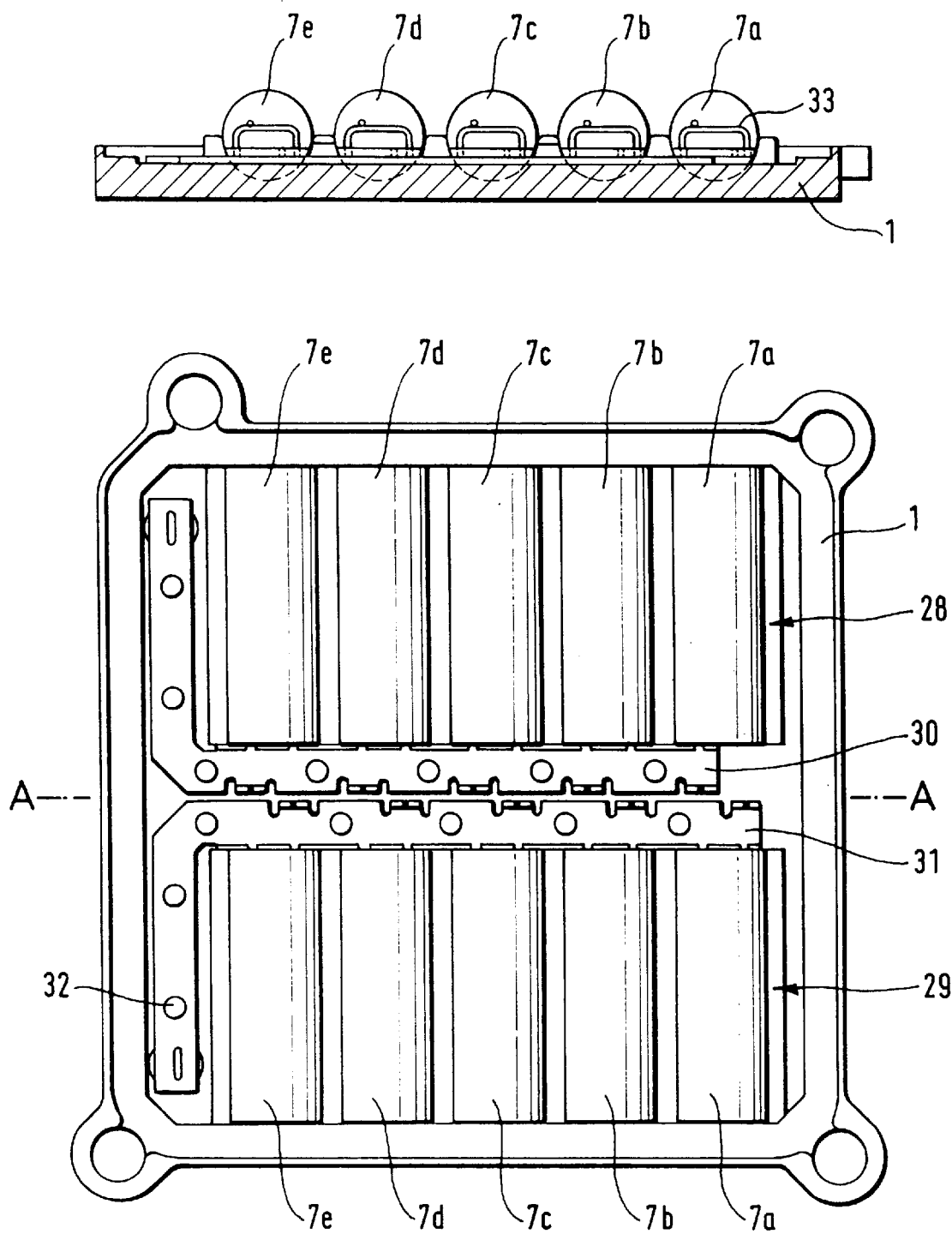
FIG. 7: shows a plan view of the first housing part.

FIG. 7 shows a plan view of the housing part 1 with the capacitors 7a to 7e, as seen from inside the housing. In each case, 5 capacitors 7a, 7b, 7c, 7d, 7e are arranged in parallel next to one another in the manner shown in FIG. 6. The capacitors arranged in this manner form two adjacent rows 28 and 29.

These two regions 28, 29 are isolated by two baffle plates 30, 31. In this arrangement, each baffle plate is of L-shaped design, and its limbs enclose a respective capacitor unit 28 or 29 approximately at right angles. In this case, the baffle plate 30 is connected to the supply voltage and the baffle plate 31 is connected to the ground of the appliance. The baffle plates 30, 31 are calked to the housing part 1 at the points 32. As the section corresponding to line A-A shows, the two plates 30, 31, carrying different potentials, are connected via contact bridges 33 and then form the electrical connection to the capacitors 7a to 7e at the same time, said capacitors being fitted into these contact bridges 33 and soldered. Alternatively, the capacitors 7a to 7e can be inserted into the contact bridges 33 using an insulation-piercing terminal technique.

FIG. 8 shows a plan view of the exterior view of the first housing part 1, which is designed as an aluminum cover. This figure once again shows the cooling ribs 5. The two housing parts are connected to one another by means of a screw or rivet device 13. The two housing parts 1 and 2 have the hybrid frame 34 arranged between them, which has cable guides 11 on its outer sides. When the hybrid frame 34 and the first housing part 1 are assembled, the capacitor 7 is pressed against the housing part 1, which forms the heat sink.

In the application described, currents of up to 100 amps arise, and the capacitors 7 have a capacitance of approximately 3000 to 4000 $\mu F$ in order to ensure reliable EMC protection for the circuit arrangement both against interference signals produced internally in the housing and against those acting externally.

REFERENCE SYMBOLS

1 First housing part
2 Second housing part
3 Hybrid circuit

4 Heat sink for the second housing part
5 Heat sink for the first housing part
6 Connector device
7 Capacitor unit
7a–7g Capacitor elements
8 Power electronics
9 Control electronics
10 Connector body
11 Cable guide for supply voltage
12 Electrical line
13 Screw device
14 Recess
15 Connector inlet
16 Connector element
17 Connector element
18 Bonding surface
19 Contact device for the capacitor 7
20 Weld points for the capacitor 7
21 Thermally conductive adhesive
22 Spring
23 Recess
24 Connector pin
25 Connector pin
26 Seal
27 Seal
28 Region with five capacitors
29 Region with five capacitors
30 Baffle plate
31 Baffle plate
32 Rivet
33 Contact bridge
34 Hybrid frame
35 Zener diode
36 Rivet connection

What is claimed is:

1. An electronic device for a motor vehicle, comprising an electronics unit for switching high currents in a two-part housing, a capacitor unit being arranged in said housing to suppress interference signals produced by said high currents, wherein the capacitor unit (7), which is provided with a large surface area, is thermally connected to a first housing part (1), and the electronics unit (8, 9) is thermally connected to a second housing part (2), wherein the capacitor unit (7) is fitable into a connector unit (6) which is of modular form and is mounted on the first housing part (1).

2. The electronic device as claimed in claim 1, wherein said capacitor unit (7) is prestressed against the first housing part (1) by a spring element (22) supported on the second housing part (2).

3. An electronic device for a motor vehicle, comprising an electronics unit for switching high currents in a two-part housing, a capacitor unit being arranged in said housing to suppress interference signals produced by said high currents, wherein the capacitor unit (7), which is provided with a large surface area, is thermally connected to a first housing part (1), and the electronics unit (8, 9) is thermally connected to a second housing part (2), wherein a connector unit (6) and the capacitor unit (7) are mechanically mounted independently of one another on the second housing part.

4. The electronic device as claimed in claim 2, wherein a thermally conductive adhesive layer (21) is arranged between the capacitor unit (7) and the first housing part (1).

5. The electronic device as claimed in claim 1, wherein contact elements (16, 17) of the connector unit (6), which are of integral formation and are guided outward, run below the capacitor unit (7) and are connectable to electrical connections of the electronics unit (8, 9) at a bonding surface (18) which faces an interior of the housing.

6. The electronic device as claimed in claim 5, wherein the electronics unit (8, 9) rests flat on the second housing part (2), which is of plate-like form, for the purpose of thermal coupling.

7. An electronic device for a motor vehicle, comprising an electronics unit for switching high currents in a two-part housing, a capacitor unit being arranged in said housing to suppress interference signals produced by said high currents, wherein the capacitor unit (7), which is provided with a large surface area, is thermally connected to a first housing part (1), and the electronics unit (8, 9) is thermally connected to a second housing part (2), wherein the two housing parts (1, 2) have a rib-like outer surface (4, 5) which is formed with different thicknesses.

8. An electronic device for a motor vehicle, comprising an electronics unit for switching high currents in a two-part housing, a capacitor unit being arranged in said housing to suppress interference signals produced by said high currents, wherein the capacitor unit (7), which is provided with a large surface area, is thermally connected to a first housing part (1), and the electronics unit (8, 9) is thermally connected to a second housing part (2), wherein the first housing part (1) holds individual capacitor elements (7a, 7b, 7c, 7d, 7e) forming the capacitor unit (7).

9. The electronic device as claimed in claim 8, wherein an inner surface of the first housing part (1) has semicircular depressions (23) corresponding to an outer contour of the capacitor elements (7a, 7b, 7c, 7d, 7e).

10. The electronic device as claimed in claim 8, wherein the capacitor elements (7a, 7b, 7c, 7d, 7e) form two regions (28, 29) which are isolated by baffle plates (30, 31) which connect the capacitor elements (7a, 7b, 7c, 7d, 7e) to different electrical potentials.

11. The electronic device as claimed in claim 10, wherein the baffle plates are approximately L-shaped.

12. The electronic device as claimed in claim 8, wherein the first housing part (1) rests on a hybrid frame (34) which is connected to the second housing part (2), which bears the electronics unit (8, 9), with a form fit.

13. The electronic device as claimed in claim 3, wherein a thermally conductive adhesive layer (21) is arranged between the capacitor unit (7) and the first housing part (1).

14. The electronic device as claimed in claim 3, wherein contact elements (16, 17) of the connector unit (6), which are of integral formation and are guided outward, run below the capacitor unit (7) and are connectable to electrical connections of the electronics unit (8, 9) at a bonding surface (18) which faces an interior of the housing.

* * * * *